United States Patent
Divakaruni et al.

(10) Patent No.: US 7,439,128 B2
(45) Date of Patent: Oct. 21, 2008

(54) METHOD OF CREATING DEEP TRENCH CAPACITOR USING A P+ METAL ELECTRODE

(75) Inventors: Ramachandra Divakaruni, Ossining, NY (US); Jack A. Mandelman, Flat Rock, NC (US); Dae-Gyu Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 11/124,324

(22) Filed: May 6, 2005

(65) Prior Publication Data

US 2005/0196932 A1 Sep. 8, 2005

Related U.S. Application Data

(62) Division of application No. 10/249,406, filed on Apr. 7, 2003, now Pat. No. 6,909,137.

(51) Int. Cl.
*H01L 21/8242* (2006.01)

(52) U.S. Cl. ............... 438/243; 438/386; 257/E29.346; 257/E21.396

(58) Field of Classification Search .................. 438/243, 438/244, 386, 387; 257/301, E27.092, E27.095, 257/E29.346, E21.396
See application file for complete search history.

(56) References Cited

U.S. PATENT DOCUMENTS

| | | | |
|---|---|---|---|
| 4,816,884 A | 3/1989 | Hwang et al. | |
| 4,833,094 A * | 5/1989 | Kenney | ........................ 438/243 |
| RE33,261 E | 7/1990 | Baglee et al. | |
| 5,213,999 A | 5/1993 | Sparks et al. | |
| 5,426,324 A | 6/1995 | Rajeevakumar | |
| 5,708,559 A | 1/1998 | Brabazon et al. | |
| 6,018,174 A | 1/2000 | Schrems et al. | |
| 6,057,188 A * | 5/2000 | El-Kareh et al. | ............. 438/243 |
| 6,180,480 B1 | 1/2001 | Economikos et al. | |
| 6,204,103 B1 | 3/2001 | Bai et al. | |
| 6,222,218 B1 | 4/2001 | Jammy et al. | |
| 6,352,902 B1 | 3/2002 | Aitken et al. | |
| 6,359,300 B1 | 3/2002 | Economikos et al. | |
| 6,373,091 B2 | 4/2002 | Horak et al. | |
| 6,404,000 B1 | 6/2002 | Divakaruni et al. | |
| 6,423,607 B1 * | 7/2002 | Heineck et al. | ............. 438/386 |
| 6,441,423 B1 | 8/2002 | Mandelman et al. | |
| 6,506,676 B2 | 1/2003 | Park et al. | |

(Continued)

*Primary Examiner*—Brook Kebede
(74) *Attorney, Agent, or Firm*—Scully, Scott, Murphy & Presser, P.C.; Joseph P. Abate, Esq.

(57) ABSTRACT

The present invention comprises a method including the steps of providing a substrate; forming a trench in the substrate; forming a buried plate in the substrate about the trench; depositing a dielectric layer within the trench; and then depositing a P-type metal atop the dielectric layer, where the dielectric layer is positioned between the P-type metal and the buried plate. Another aspect of the present invention provides a trench capacitor where said trench capacitor comprises a trench formed in a substrate, a buried plate formed in the substrate about the trench; a node dielectric; and a P-type metal liner deposited within the trench, where the P-type metal liner is separated from the buried plate by the node dielectric. A P-type metal is defined as a metal having a work function close to the Si valence band, approximately equal to 5.1 eV.

6 Claims, 13 Drawing Sheets

U.S. PATENT DOCUMENTS

2002/0014647 A1 2/2002 Seidl et al.
2002/0195683 A1 12/2002 Kim et al.
2003/0142458 A1 7/2003 Joo et al.

* cited by examiner

METHOD OF CREATING DEEP TRENCH CAPACITOR USING A P+ METAL ELECTRODE

RELATED APPLICATIONS

This application is a divisional of U.S. application Ser. No. 10/249,406, filed Apr. 7, 2003 now U.S. Pat. No. 6,909,137.

BACKGROUND OF INVENTION

This invention generally relates to a method of fabricating a semiconductor memory device. More particularly, this invention relates to a method for incorporating a P-type metal electrode into a trench capacitor suitable for use in high-density integrated circuits.

Embedded memory devices fabricated within deep trench capacitors and/or vertical transistor cells have great benefits over planar-stacked device structures. Trench capacitors have replaced the planar storage capacitor in order to meet the scaling demands for high performance DRAM (dynamic random access memory) cell production.

A trench capacitor is a three dimensional device formed by etching a trench into a semiconductor substrate. After trench etching, a buried plate electrode is formed about the exterior portion of the trench and a node dielectric is then formed on the inner walls of the trench. The trench is then filled, for example, with N-type polycrystalline silicon ("N-type Poly-Si"). In order to obtain sufficient capacitance, a dopant level of about $10^{19}$ atoms/cm$^3$ is commonly utilized. The doped Poly-Si serves as one electrode of the capacitor, often referred to as the upper electrode or storage node. An N-type doped region surrounds the lower portion of the trench, serving as the second electrode and is referred to as the lower electrode or a "buried plate" or "diffusion plate". A node dielectric separates the buried plate and the upper electrode and serves as the insulating layer of the capacitor.

Currently, trench capacitors are formed within an integrated circuit by filling the previously formed trench with appropriately doped poly-Si. A common method for depositing poly-Si, for the upper electrode, is by chemical vapor deposition. A significant disadvantage associated with this prior method is that the poly-Si upper electrode has a relatively high electrical resistivity as compared to elemental metals. The high electrical resistivity of the poly-Si material, as the top electrode, accordingly limits the speed of the resulting device. Other disadvantages associated with the use of doped poly-Si, as an upper electrode material, include, for example, leakage due to parasitic transistors and gate depletion effects. Both of these phenomenon decrease the capacitance of the device.

One approach for overcoming the disadvantages associated with poly-Si electrodes is utilizing a metal conductor as the upper electrode, however, there are very few materials which can withstand the high thermal processing temperatures upward of 1000° C. required of deep trench capacitor/transistor structures without degrading of the node dielectric's integrity.

SUMMARY OF INVENTION

A method is provided for fabricating deep trench capacitors, more particularly, to providing trench capacitors incorporating low resistivity (on the order of about 10 micro-ohm-cm to 1.0 milli-ohm-cm) thermally stable P-type metal electrodes. The method of the present invention comprises the steps of: forming a trench in a substrate; forming a buried plate in the substrate about the trench; depositing a dielectric layer within the trench; and depositing a P-type metal atop the dielectric layer.

P-type metals are defined herein as, metal conductors having a work function in proximity to the valence band of Si. The valence band of Si is approximately 5.1 eV. The present invention decreases signal delays inherent in conventional trench capacitor designs by incorporating P+ metal electrodes that are thermally stable at temperatures above 1000° C. Incorporating low resistivity P-type metal electrodes with a resistivity on the order of 4x less than conventional N+ doped poly-Si electrodes reduces signal delays to produce high performance capacitor structures.

Another aspect of the present invention-includes the structure-provided by the inventive method where P-type metal electrodes are incorporated as the upper electrode of a capacitor structure. More specifically, a trench capacitor is provided which includes a trench formed in a substrate, a buried plate located in the substrate about the trench; a node dielectric lining the trench walls; and a P-type metal liner located atop the node dielectric. P-type metals include, but are not limited to: TiAlN, Re, Mo, Ir/IrO$_2$, Ru/RuO$_2$, and Ru—Ta, with TiAlN being most preferably. TiAlN demonstrates P-type conduction behavior and is thermally stable up to 1000° C.

P-type metal electrodes decrease capacitor leakage by increasing the threshold voltage required of vertical parasitic transistors to conduct. Vertical parasitic transistors are positioned on the sidewalls of the trench between the N+ buried strap diffusion regions and the N+ buried plate regions. The gate of the parasitic transistor is the storage capacitor node of the capacitor, and the source/drain regions are the N+ buried strap diffusion region and the N+ buried plate diffusion region.

Additionally, incorporating a P-type metal instead of N-type poly-Si as the upper electrode of the capacitor causes a work function shift between the top electrode and the buried plate of the capacitor, which corresponds to an increase in the threshold voltage required for the vertical parasitic transistor to conduct. More specifically, P-type metals have a work function of approximately 5.1 eV while the N+ poly-Si has a work function of approximately 4.05 eV. The increase in the work function from N+ poly-Si to P+ metal, is approximately 1.1 eV and increases the threshold voltage of the parasitic transistor by 1.1 V.

Utilizing P-type metals as the upper electrode of the capacitor increases the threshold voltage of the vertical transistor so that the thick collar oxide structures are no longer required in order to control the conduction of the vertical transistor and capacitor leakage. Therefore, a DRAM configuration is provided comprising a trench including a capacitor positioned in a lower portion of the trench, where the capacitor includes a buried plate and a P-type metal liner, where the buried plate and the P-type metal liner are separated by a node dielectric; and a vertical transistor positioned atop and electrically connected to the capacitor through a diffusion strap region, where a parasitic transistor is formed between the buried strap diffusion region and the buried plate, the parasitic transistor not requiring a collar oxide region in order to avoid conduction.

The physical substitution of a P-type metal for N-type doped poly-Si as the upper electrode results in a work function shift. Therefore, in order for full appreciation of the advantages of the P-type metal electrical modifications must be employed to compensate for the work function shift.

Another aspect of the present invention is a method for storing a 1 in a trench capacitor having a P-type metal upper electrode comprising the steps of: applying a bias of approximately 1.6 V to the P-type metal upper electrode; and applying a bias of approximately 0.0 V to a N-type doped Si buried plate, where the P-type metal upper electrode is separated from the N-type doped buried plate buried plate by a node dielectric positioned between the P-type metal upper electrode and the N-type doped buried plate buried plate. Additionally, the present invention also provides a method for storing a "0" in a trench capacitor having a P-type upper electrode comprising the steps of: applying a bias of approximately 0.6 V to the P-type metal upper electrode; and applying a bias of approximately 0.0 V to a N-type doped buried plate buried plate, where the P-type metal upper electrode is separated from the N-type doped Si buried plate by a node dielectric positioned between the P-type metal upper electrode and the N-type doped Si buried plate.

Additionally, by removing N+ doped poly-Si from the device the incidence of poly depletion effects can be reduced. Poly depletion effects are the effective thickening of the node dielectric due to depletion of dopants at the Poly-Si/Node dielectric junction when voltage is applied to the upper electrode. The thickness of the node dielectric is hereafter referred to as the equal oxide thickness (EOT). Therefore, by increasing the EOT of the node dielectric the distance between the capacitor plates (top electrode, buried plate) is increased. Capacitance is directly proportional to the area of each plate and inversely proportion to the distance between the plates. By decreasing the incidence of poly-Si depletion, one can further reduce the equivalent oxide thickness, increasing node capacitance.

Compared to the current designs, utilizing N+ poly-Si top electrodes, the present invention improves the device performance by decreasing the resistance of the device through incorporating low resistance P-type metals as the top electrode of the device; decreasing capacitor leakage through vertical transistor conduction; and decreasing the incidence of poly-depletion.

DETAILED DESCRIPTION

Figure 1:
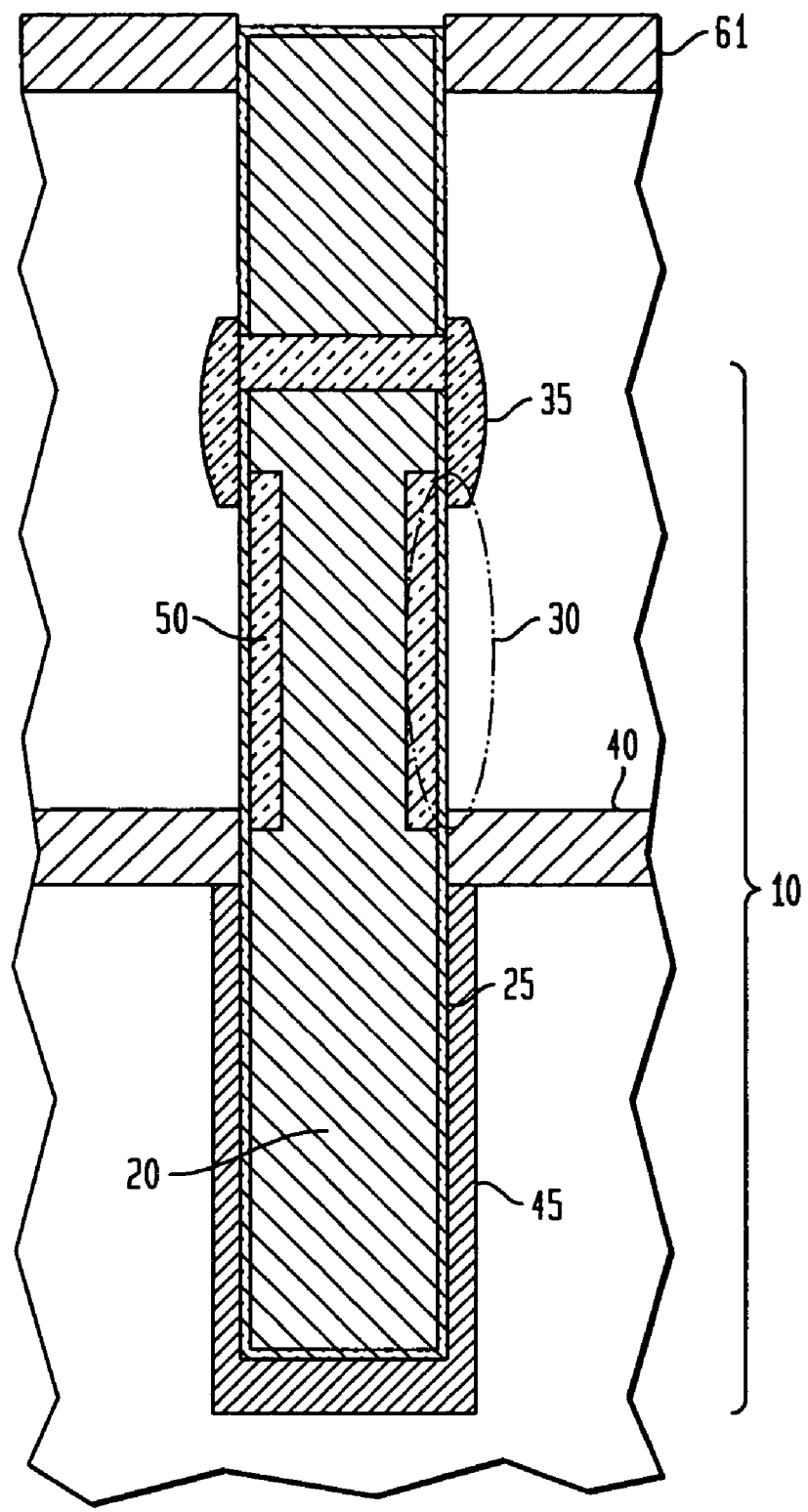
FIG. 1 is a pictorial representation (through cross-sectional view) of a prior art trench capacitor structure.

The present invention, which incorporates a low resistance P-type metal top electrode into a high performance deep trench capacitor, will now be described in more detail by referring to the figures that accompany this application. A P-type metal is defined as a metal having a work function in proximity to the valence band of Si, which is about 5.1 eV. It should be noted that in the accompanying drawings, like reference numerals are used for describing like and corresponding elements.

One advantage of P-type metal-electrodes over conventional polysilicon electrodes is that incorporating a P-type metal as the upper electrode decreases the resistance within the capacitor, therefore increasing the performance of the device. Incorporating P-type metal electrodes decreases the resistance of the device by about a factor of 4, when compared to capacitor designs utilizing conventional poly-Si electrodes. By reducing the resistance of the upper electrode the time required to charge and discharge the capacitor is reduced. Additionally, by utilizing P-type metal electrodes it is possible to control parasitic transistor effects without incorporating collar oxide regions. P-type metal electrodes also decrease the incidence of leakage from the capacitor storage node.

In conventional trench capacitors 10, referring to FIG. 1, N+ doped poly-Si is utilized as the upper electrode 20, also referred to as the capacitor node, and a parasitic transistor 30 exists along the sidewall of the trench between N+ doped strap diffusion region 35 and the N+ buried well 40. If the parasitic transistor 30 conducts, there is a leakage from the N+ strap diffusion region 35 to the N+ buried plate 45, which is electrically connected to the N+ buried well 40. Conventionally, in order to prevent the parasitic transistor 30 from conducting, a relatively thick collar oxide region 50 is positioned between the N+ buried strap diffusion region 35 and the N+ buried well 40 in order to increase the threshold voltage required for the parasitic transistor 30 to conduct.

The application of the collar oxide region 50 creates a number of difficulties. First, higher performance DRAM and EDRAM (embedded dynamic random access memory) devices and high integration of those devices into integrated circuits (IC's) requires downscaling of device dimensions. In conventional designs, in order to control the threshold voltage of parasitic transistors a collar oxide region 50 is required, which is of a specific thickness that is not scaleable. Therefore, as the capacitor dimensions are reduced the thickness of the collar oxide region 50 remains constant, resulting in a decreasing trench diameter that is difficult to fill. Even if a conductor can be deposited into the trench it will have a smaller radius than would be possible if the collar oxide region 50 was not present. Therefore, in addition to comprising of high resistivity N+ polysilicon the resistance of the upper electrode 20 is further increased by filler impurities and a smaller electrode radius than is possible if the collar oxide region 50 is not present.

By incorporating P-type metal for upper electrode 20 it is possible to substantially thin and even to remove the collar oxide region 50. The consequence of replacing N-type poly-Si with a P-type metal is that it increases the threshold voltage required for the parasitic conduction by about 1.1 V, which reflects the difference between the work function of N-type poly-Si, 4.05 eV, and P-type metals, having a work function of approximately 5.1 eV. By incorporating a P-type metal as the upper electrode 20, the threshold voltage, required for the parasitic transistor 30 to conduct, is increased by 1.1 V, so that the collar oxide region 50 is no longer required.

Another advantage of utilizing P-type metals for the upper electrode 20 as opposed to N-type doped poly-Si is that the incidence of poly depletion is reduced. In conventional capacitor designs, where a N-type doped poly-Si upper electrode 20 is positioned atop a node dielectric 25, as a voltage is applied to the upper electrode 20 a thin depletion layer is formed at the interface between the N-type doped poly-Si 20 and the node dielectric 25. The introduction of the depletion layer increases the equal oxide thickness (EOT) of the node dielectric 25. The node dielectric 25 separates the electrode plates 20, 45 of the capacitor 10. Therefore the incidence of poly-depletion effects decreases the capacitance of the capacitor because the greater distance between the capacitor plates the lower the capacitance. Replacing N+ polysilicon with P-type metal at the upper electrode 20 and node dielectric 25 interface, results in the removal of the poly-Si depletion region, therefore reducing the EOT of the dielectric 25 and effectively increasing the node capacitance of the capacitor.

Figure 2:
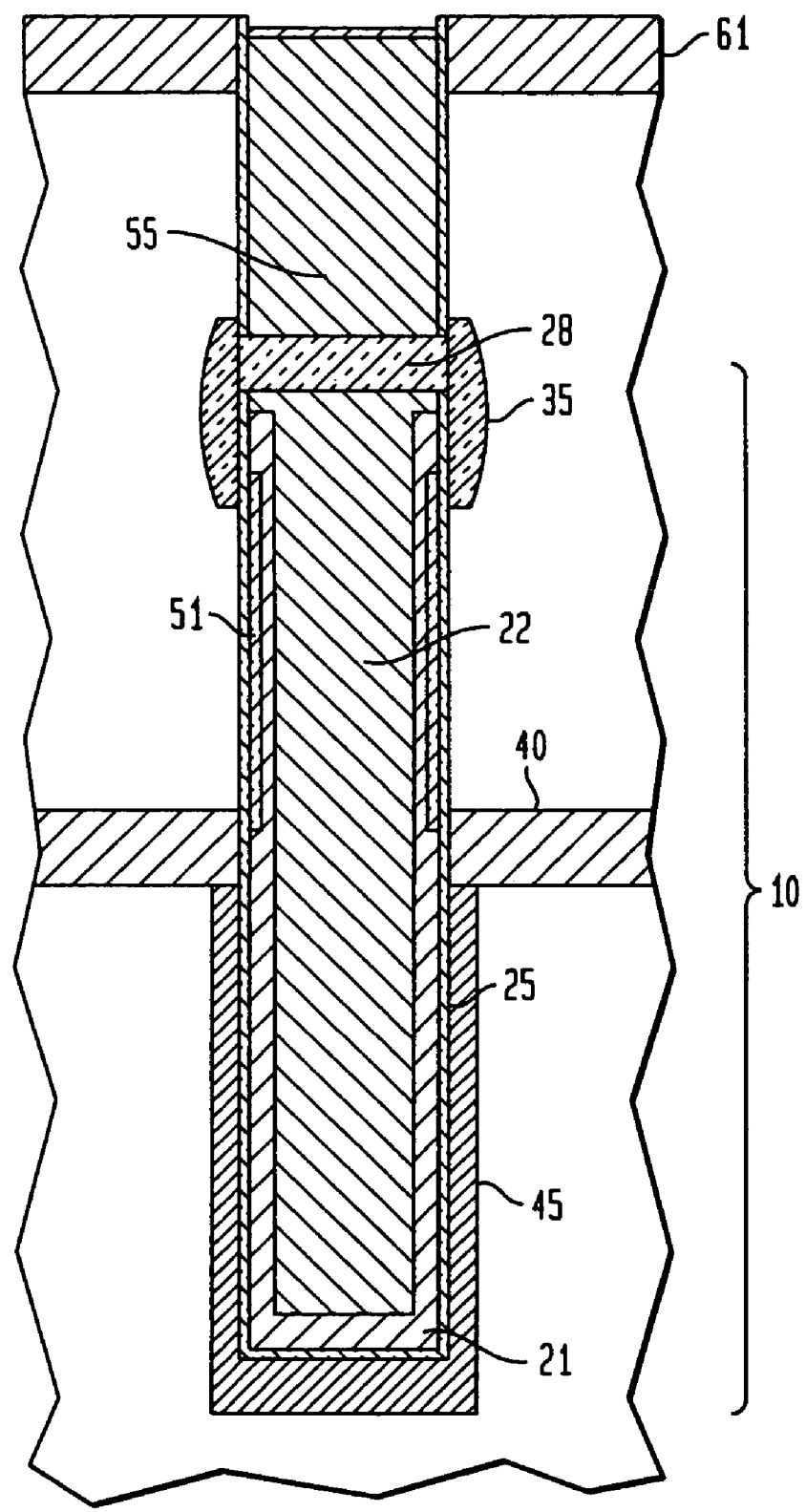
FIG. 2 is a pictorial representation (through cross-sectional view) of a trench capacitor structure incorporating P-type metal top electrodes.

FIG. 2 depicts a P-type metal electrode 21 in a DRAM. The DRAM, includes a gate conductor 55 formed in the top portion of a deep trench and a deep trench capacitor 10, which is formed in the lower portion of the deep trench. The term deep trench is used herein to denote a trench whose depth from the top surface of Si-containing substrate 1 is from about 1.0 μm or greater. Although deep trench capacitors are depicted in FIG. 2, the process steps and structures are equally applicable to moderate and shallow trench configurations. The deep trench capacitor 10 includes a buried plate region 45 of N-type material; a node dielectric 25, formed atop the buried plate region 45; a metal liner 21 formed atop the node dielectric 25; and a capacitor node 22 of N+ polysilicon, which is deposited over the metal liner 21. Optionally, the capacitor node 22 fill material comprises of P-type metal or any other low resistance metal conductors. A trench top oxide layer 28 separates the gate conductor 55 in the upper deep trench region and the node fill 22, positioned in the lower deep trench region.

A buried out diffusion strap region 35 electrically connects one source/drain region of the vertical MOSFET controlled by gate conductor 55, in the upper region of the trench, with the deep trench capacitor 10, that is positioned in the lower region of the trench. As used herein, the upper portion of the trench refers to the section above and including the trench top oxide 28 and the lower portion refers to the section below the trench top oxide 28. The P-type metal electrode 21, by increasing the threshold voltage required for the parasitic transistor to conduct, allows for reduced thickness collar oxide regions 51 positioned between the N+ doped strap diffusion region 35 and the N+ buried well regions 40. Optionally, the reduced collar oxide regions 51 may be removed entirely.

The DRAM may be incorporated into a substrate 1 that is lightly doped using P-type dopants, such as Boron. Additionally, the substrate 1 may incorporate various devices. For example, the substrate 1 may incorporate a buried well 40 comprising N-type dopants, such as P or As. Although not depicted, the various devices that may be incorporated into the substrate are well known in the art and are contemplated herein.

Figure 3:
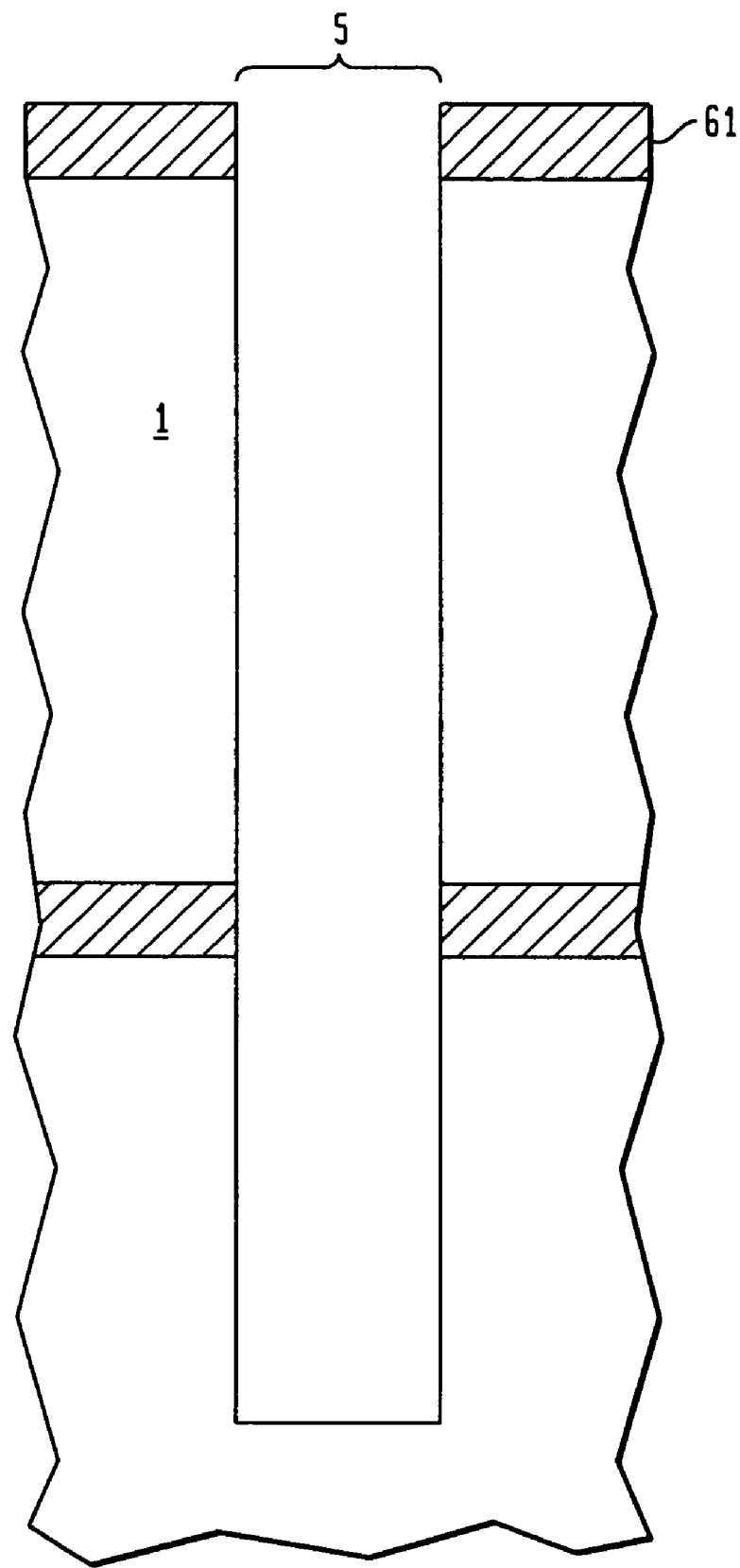
FIGS. 3-9 are pictorial representations (through cross-sectional views) showing the basic processing steps that are employed in the present invention.

The various process steps for producing the inventive deep trench capacitor will now be discussed in greater detail. Referring to FIG. 3, the initial structure comprises of a deep trench 5 that have been etched into a substrate 1, where the deep trench 5 has sidewalls that extend to a common bottom wall. Although FIG. 3-FIG. 9 depict a single DRAM cell, a plurality of DRAM cells are also contemplated.

The substrate may comprise any conventional semiconductor material known in the art including, but not limited to: Si, Ge, SiGe, GaAs, InAs, InP, or other III/IV compounds. The substrate may be doped with P or N-type dopants or may be undoped. Preferably, the substrate is lightly doped with P-type dopants, such as boron.

The substrate 1 may contain various isolation and/or active device a regions. For clarity, such regions are not shown in the drawings, but are nevertheless meant to be included within the substrate 1. N+ bitline regions 61 are then formed atop the surface of substrate 5 using ion implantation and activation annealing.

A patterned pad layer (not shown), which serves as the trench mask utilized during the etching of the trench, is formed on a surface of substrate 1 utilizing conventional processes well known to those skilled in the art including deposition and/or thermal growing. The pad layer may comprise of a single material layer, or alternatively, the pad layer comprises of a multilayered structure. For example, the pad layer may comprise an oxide, a nitride, or a doped silicate glass material, or a stack including two or more of the aforementioned materials may be employed.

Following application of the pad layer to the surface of substrate 1, the pad layer is then patterned using conventional lithography and etching. A photolithographic mask (not shown) is produced, by applying a photoresist layer (not shown) on the exposed surface layer of the surface to be etched utilizing a conventional deposition process. The photoresist layer is then patterned utilizing conventional lithography so as to expose selective regions of the pad stack in which trenches are to be formed. The lithography step employed in the present invention includes exposing the photoresist to radiation to form a pattern in the photoresist and developing the pattern. The pattern (not shown) is then transferred into the underlying pad layer using a conventional etching process such as reactive-ion etching, ion beam etching, plasma etching or laser ablation that is highly selective in removing pad material as compared to photoresist.

Etching of the trench 5 into the substrate is performed using a conventional timed etch process step that is highly selective in removing substrate 1 as opposed to pad layer or photoresist. Conventional dry etching process include, but are not limited to: RIE, ion-beam etching, plasma etching or any other like dry etch process. A combination of the aforementioned dry etch processes may also be used in providing the trench 5. In the present invention, the final depth of each trench 5 after the timed etching has been performed, as measured from the top surface of the substrate, is from about 4 to about 10 μm. The photoresist can be removed after any of the etching steps mentioned above.

Figure 4:
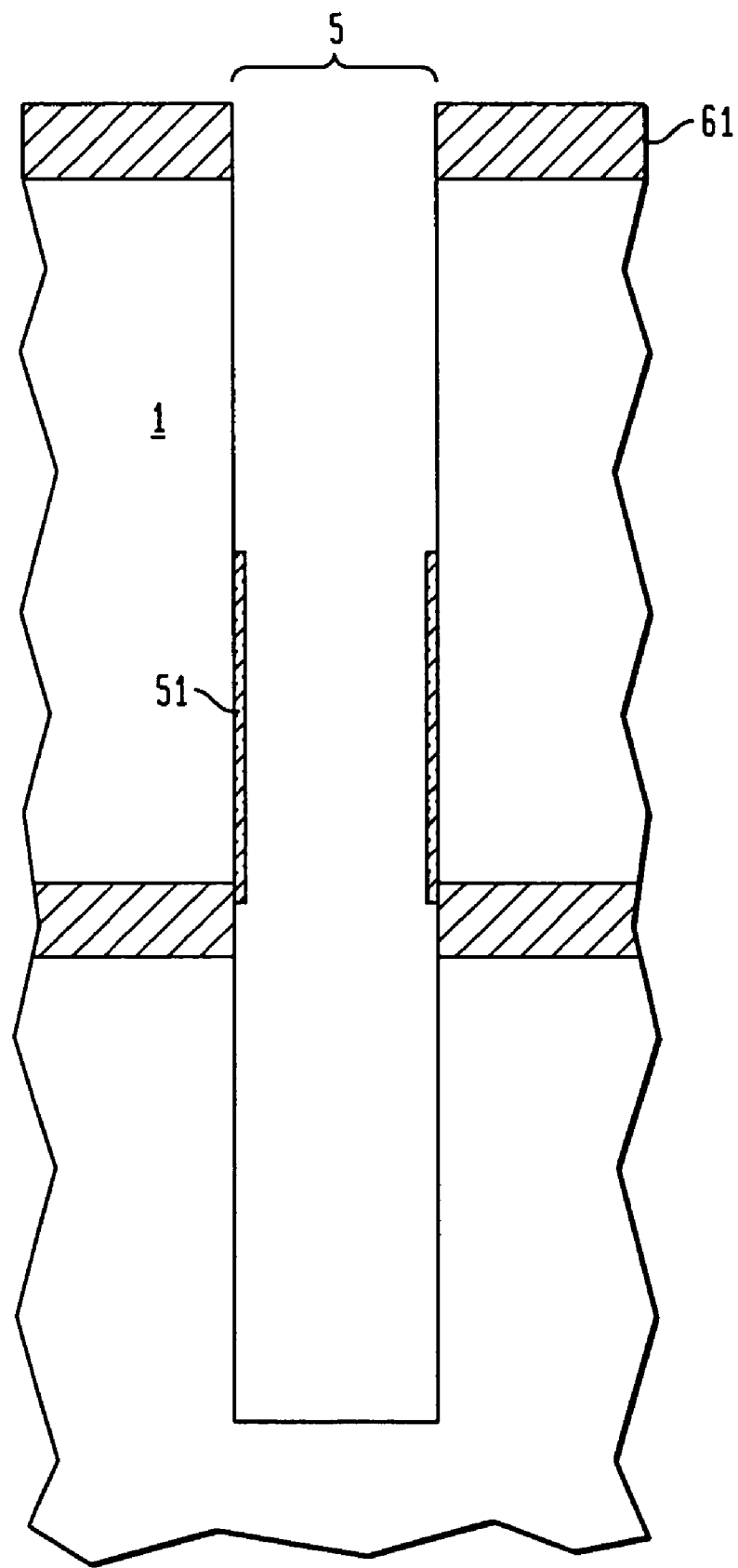

Referring to FIG. 4, following trench etching process steps a reduced thickness collar oxide region 51 is formed within the trench region 5. Fundamentally, a poly-Si buffered LOCOS (local oxidation of silicon) collar or other like reduced thickness collar oxide region 51 is thermally grown on the sidewalls of the deep trench. The collar oxide region 51 prevents leakage of the later formed buried out diffusion strap 35 to the buried plate 40. In conventional deep trench capacitor structures the collar oxide 51 is required to be relatively thick in order to avoid leakage from the later formed parasitic resistors 30. Leakage is undesirable as it degrades the retention time of the cell. The incorporation of P-type metal electrodes increases the threshold voltage required for the parasitic transistor to conduct so that the thickness of the collar oxide region 51 may be reduced. Optionally, the reduced collar oxides 51 may be removed from the deep trench structure entirely.

Figure 5:
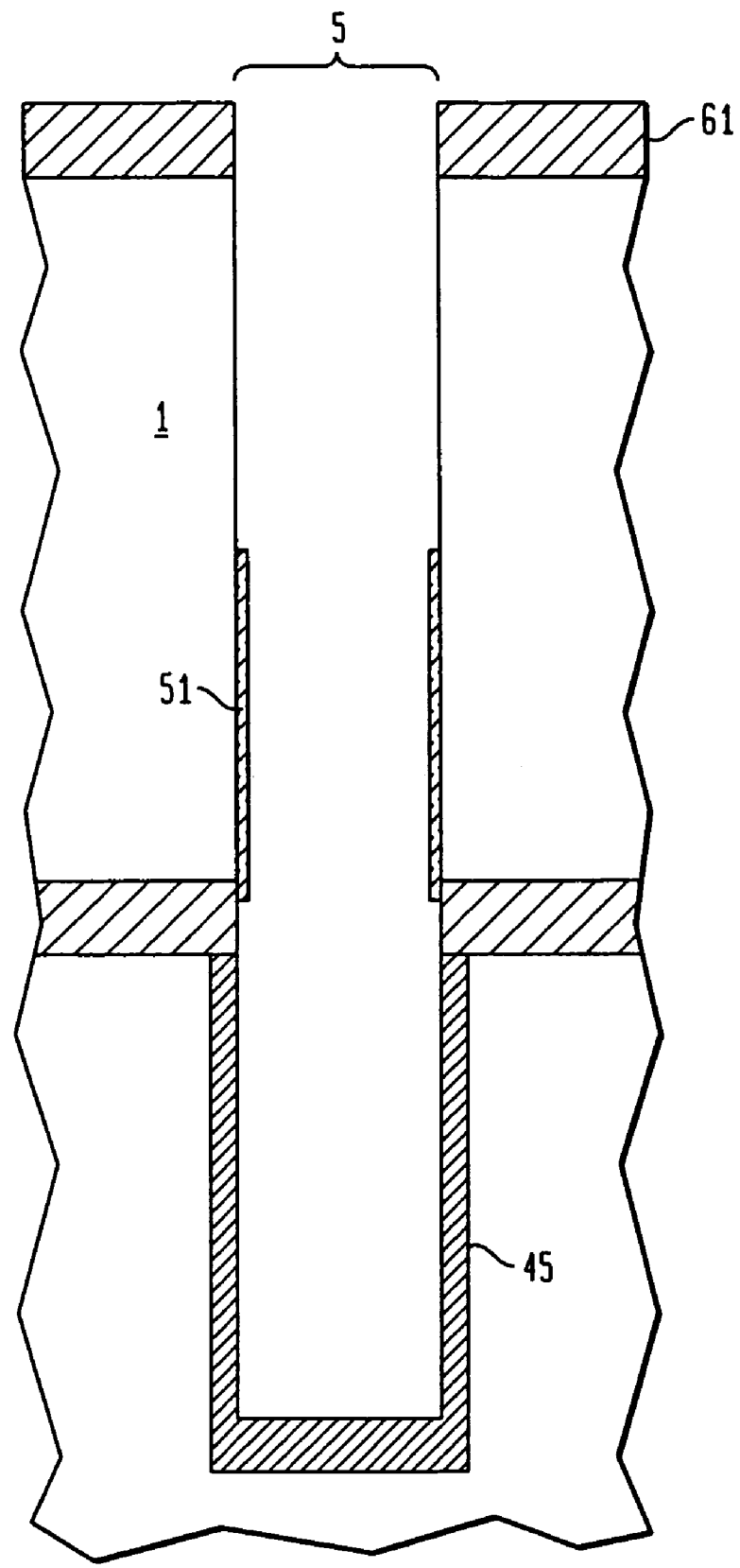

Referring to FIG. 5, an N+ buried plate diffusion region 45 is then formed about the exterior walls of the lower trench regions using a conventional process that is capable of diffusing N+ dopant through the trench walls. The buried plate diffusion region 45 functions as one of the electrodes for the capacitor. Producing the N+ buried plate diffusion region 45 begins with introducing a dopant source to the sidewalls of the trench and then thermally diffusing the dopant into the substrate 1.

The dopant source to produce a N+ buried plate diffusion region 45 may be introduced by ion-implanting an impurity, such as As or P, into a bottom portion of a trench. Preferably, As is ion-injected through the trench under the conditions of an accelerating voltage, of about 40 kV, and at about dose of $10^{15}/cm^2$. Depositing a layer of N-type doped material such as arsenic doped silicate glass, may also form the N+ buried plate diffusion region 45. After the impurities are introduced to the sidewalls of the trench 10 the substrate 1 is then heated in an $N_2$ atmosphere at a temperature of about 900° C. for about 30 minutes, thereby diffusing N-type dopants into the substrate 1 and forming a N-type impurity buried plate diffusion region 45 around the bottom portion of the trench 5.

Connecting the N+ buried plate diffusion region 45 of the capacitor to other devices within the substrate 1 is a buried well 40. Alternatively, the capacitor may be electrically connected through the out diffused N+ buried-plate diffusion regions 45, where under process conditions well known in the art the buried plate diffusion regions 45 diffuse further into the substrate 1 electrically contacting other active device regions incorporated within the substrate 1.

Figure 6:
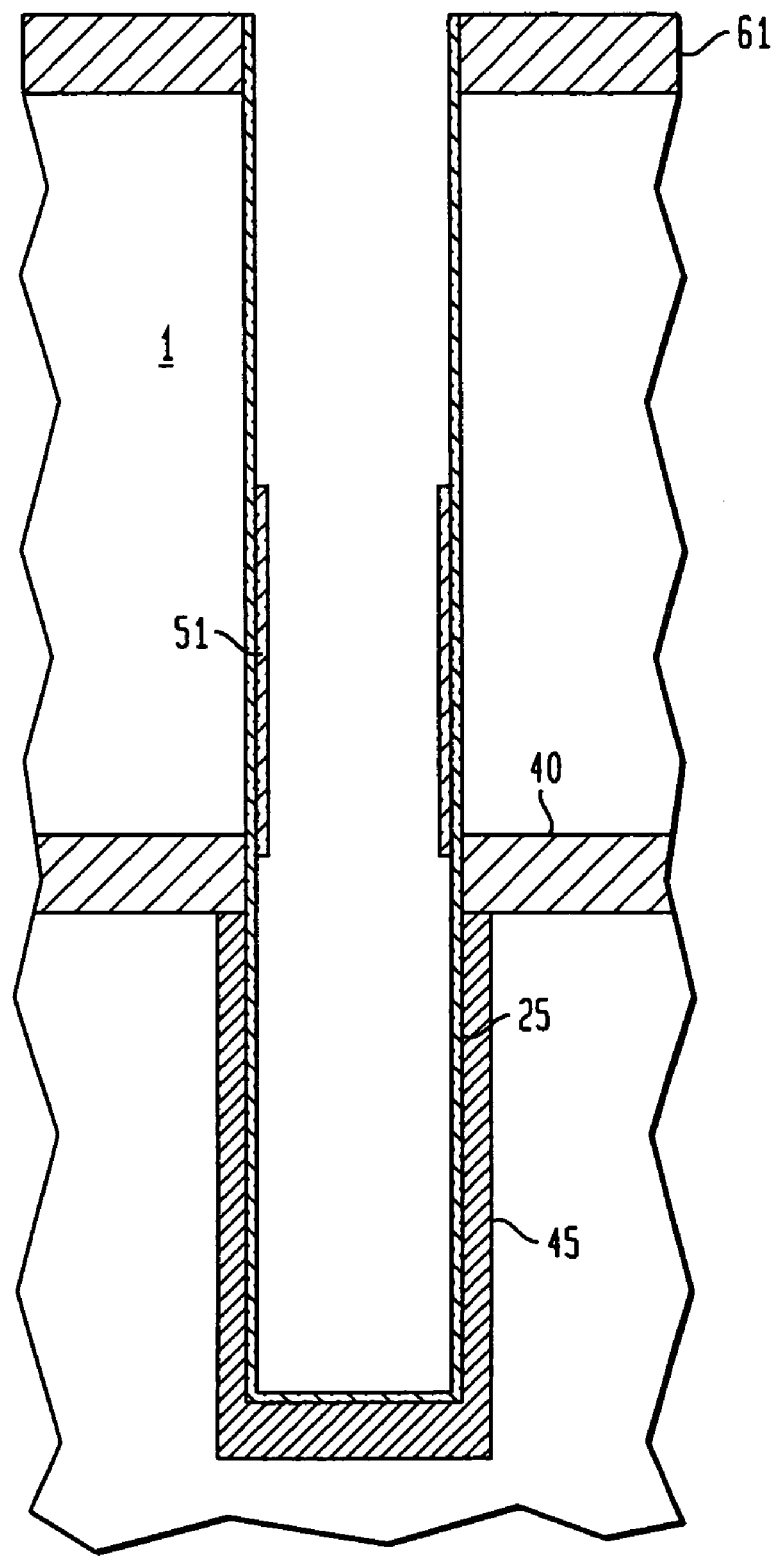

Referring to FIG. 6, a node dielectric layer 25 is then conformally formed on the sidewalls and base of the lower trench region and extends from the lower portion of the deep trench to the upper surface of the deep trench. The node dielectric layer 25 is positioned between and separates the electrodes of the capacitor 21, 45. Node dielectric 25 employed at this stage of the present invention comprises any dielectric material including, but not limited to: $Si_3N_4$, $SiO_2$, $Al_2O_3$, $ZrO_2$, and $HfO_2$. Node dielectric layer has a thickness of from about 2.5 to about 7.0 nm, with a thickness of from about 3.0 to about 5.0 nm being more highly preferred.

Figure 7:
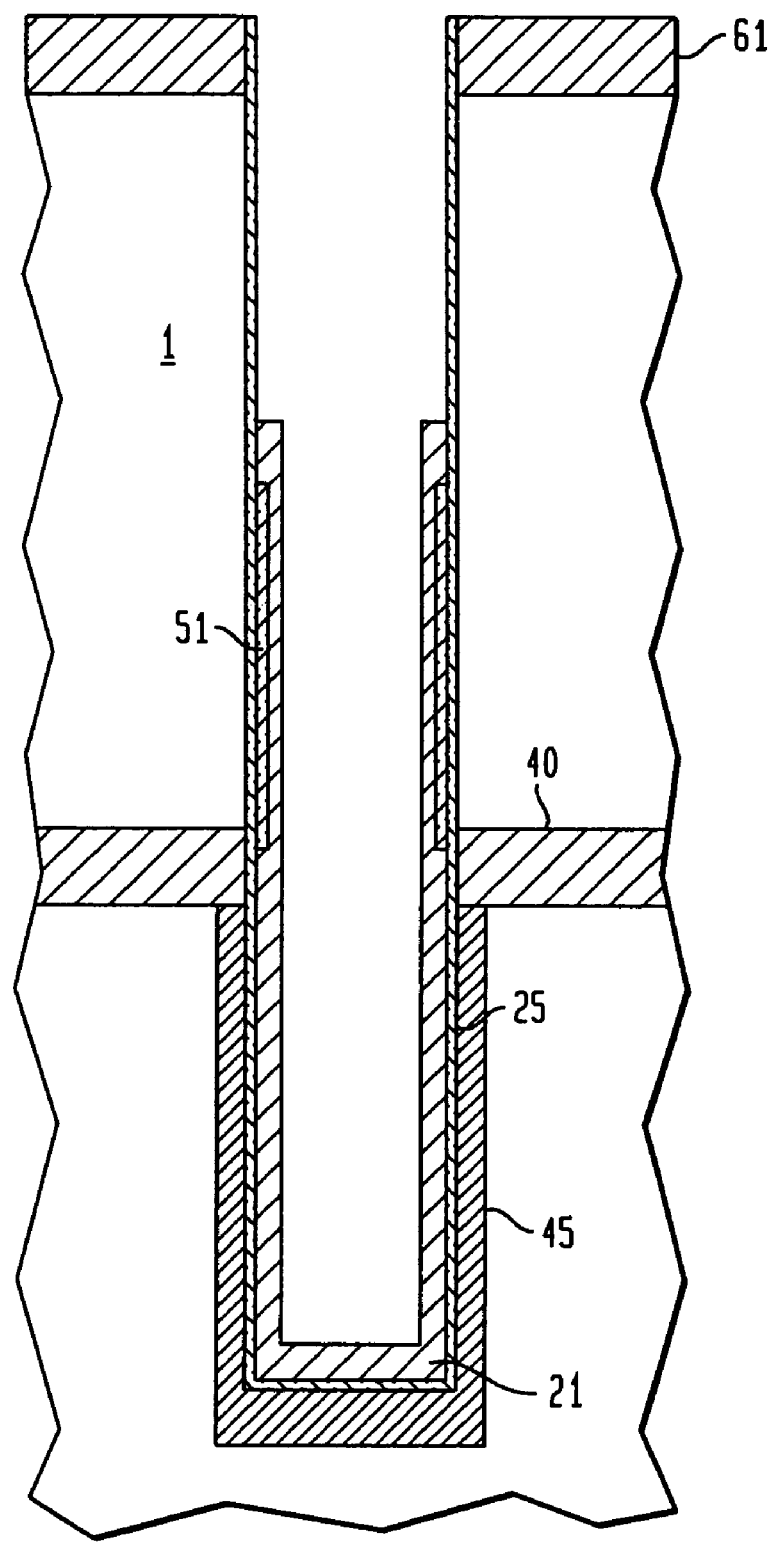

Referring to FIG. 7, following node dielectric 25 formation, P-type metal electrode 21 is then formed atop the node dielectric layer 25. P-type metal electrode 21 is a metal liner comprising of a thermally stable P-type metal having a work function in proximity to the valence band of Si. Work function is defined as the energy needed to ionize an element, in other words the energy needed to withdraw an electron. The metal electrode has a thickness of from 2 nm to 100 nm.

Examples of P-type metals include, but are not limited to, TiAlN, Re, Mo, Ir/$IrO_2$, Ru/$RuO_2$, RuTa and combinations thereof; most preferably TiAlN is employed. TiAlN demonstrates P-type conduction behavior, having a work function close to the Si valence band, approximately equal to 5.1 eV, and is thermally stable up to about 1000° C.

The method for preparing TiAlN material for utilization as a top electrode 21 will now be discussed in greater detail. The work function value of $(Ti_xAl_y)_{1-z}N_z$ film depends on the amount of nitrogen (N) in the above chemical composition. If z, representing the amount of nitrogen (N), in the $(Ti_xAl_y)_{1-z}N_z$ composition ranges from about 0.3 to about 0.6, the work function value ranges from about 4.8 eV to about 5.0 eV. In other words if the composition or mole fraction of nitrogen (N) is more than 30% or 0.3, a work function is obtained ranging from about 4.8 eV to about 5.0 eV. Therefore, in the present invention, $(Ti_xAl_y)_{1-z}N_z$ film containing a large amount of nitrogen (N) ranging from about 30% to about 60% is used as a P-type metal to provide an electrode with a work function similar to the conduction band of Si.

In order to form the preferred $(Ti_xAl_y)_{1-z}N_z$ film having a high work function of about 5.1 eV (where, z ranges from about 0.3 to about 0.6) in P-type metal electrode, nitrogen reactive sputtering using a $Ti_xAl_y$ target is performed, where a ratio, x/y of the composition x of titanium (Ti) to the composition y of aluminum (Al) ranges from about 0.5 to about 20. At this time, the flow rate of nitrogen (N) ranges from about 30 sccm to about 100 sccm, the flow rate of argon (Ar) ranges from about 5 sccm to about 30 sccm and a RF power ranges from about 0.05 kW to about 15 kW.

Meanwhile, the disclosed method may implement chemical vapor deposition (CVD) method or advanced CVD using as a precursor to $(Ti_xAl_y)_{1-z}N_z$ film so that the work function value can be adjusted. At this time, the precursor of titanium (Ti) may include one of $TiCl_4$, TDEAT (tetrakis diethylaminotitanium) and TDMAT (tetrakis dimethylaminotitanium), the precursor of aluminum (Al) may include one of $Cl_3$ and TMA (Tri Methyl Aluminum, $[Al(CH_3)_3]$), and a source of nitrogen (N) may use one of $NH_3$, $N_2$ and $ND_3$.

Further, the disclosed method may implement atomic layer deposition (ALD) to change the composition of the $(Ti_xAl_y)_{1-z}N_z$ film so that the work function value can be controlled. At this time, the precursor of titanium (Ti) may include one of TiCl4, TDEAT (tetrakis diethylaminotitanium) and TDMAT (tetrakis dimethylaminotitanium), and the precursor of aluminum (Al) may include one of $AlCl_3$ and $TMA[Al(CH_3)_3]$. During the time between cycles when the $(Ti_xAl_y)_{1-z}N_z$ film is deposited using the precursor, one of $NH_3$, $N_2$ and $ND_3$ for purging materials may be used in order to adjust the nitrogen (N) content. The precursor can be deposited at the temperature ranging from about 50 to about 650° C. and at the pressure ranging from about 0.05 Torr to about 30 Torr. At this time, the composition of nitrogen (N) is controlled by the number of each of the cycles.

As another method, remote plasma CVD (RPCVD) method may be employed. At this time, if ECR (electron cyclotron resonance) is used as a plasma source for remote plasma, the frequency ranges from about 2.0 to about 9 GHz may be used and one of helium (He), argon (Ar), krypton (Kr) and xenon (Xe) may be also used when a plasma is excited. Also, the flow rate of a used gas is controlled to control the relative amount of Ti/Al/N. At this time, when the precursor is deposited by means of remote plasma CVD method, a metal source such as titanium (Ti), aluminum (Al), and the like is injected into the chamber. However, the precursor is sprayed around the wafer and a nitrogen (N) source is introduced around the wafer by exciting the precursor around the plasma.

Figure 8:
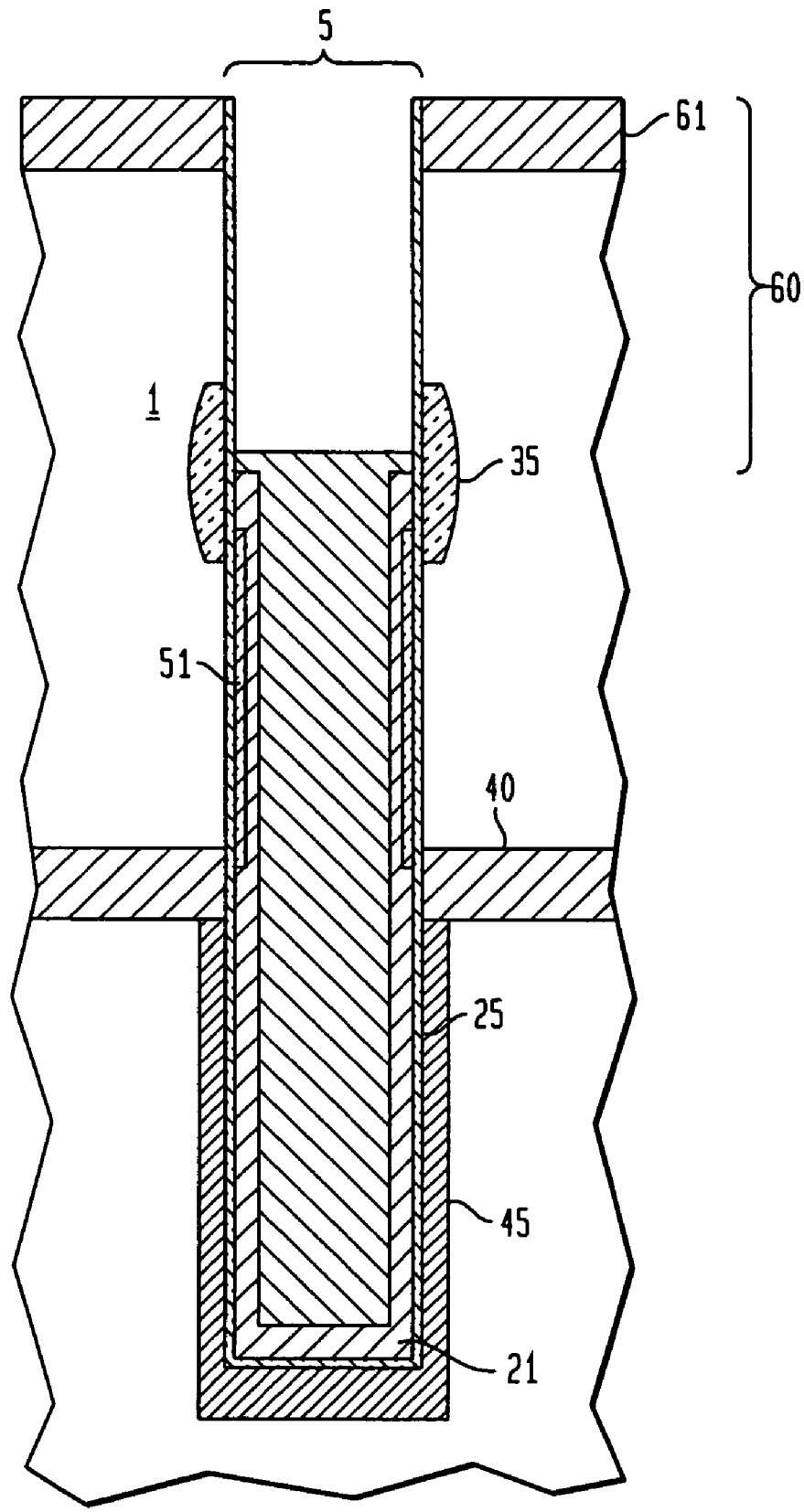

Now referring to FIG. 8, following the deposition of the P-type metal top electrode 21 a fill material is then deposited atop the P-type metal top electrode 21 and recessed to fill the lower portion of the trench 5 and form the capacitor node 22. Fill material typically includes silicon or poly-Si. The fill material is typically deposited using deposition processes well known in the art including but not limited to: chemical vapor deposition (CVD), plasma-assisted CVD, high-density chemical vapor deposition (HDCVD), plating, sputtering, evaporation and chemical solution deposition. The deposited poly-Si must be doped with N-type dopant such as As or P to form an electrically conductive path. Alternatively, the fill material may comprise P-type metal or low resistance metal conductors. Thereafter the deep trench conductor is recessed by conventional means to a preferred depth.

The following process steps are incorporated for forming a DRAM cell and are well known within the art. Although the following process steps are well known in the art they are incorporated herein as follows.

A buried diffusion strap 35 couples the capacitor to the later formed overlying transistor 60. The overlying transistor 60, is the vertical MOSFET access transistor formed on the sidewalls of the upper portion of the trench. The vertical MOSFET access transistor 60 allows the storage capacitor in the lower portion of the trench to exchange charge with the bitline 61, under the controlling action of the gate conductor 70.

Figure 9:
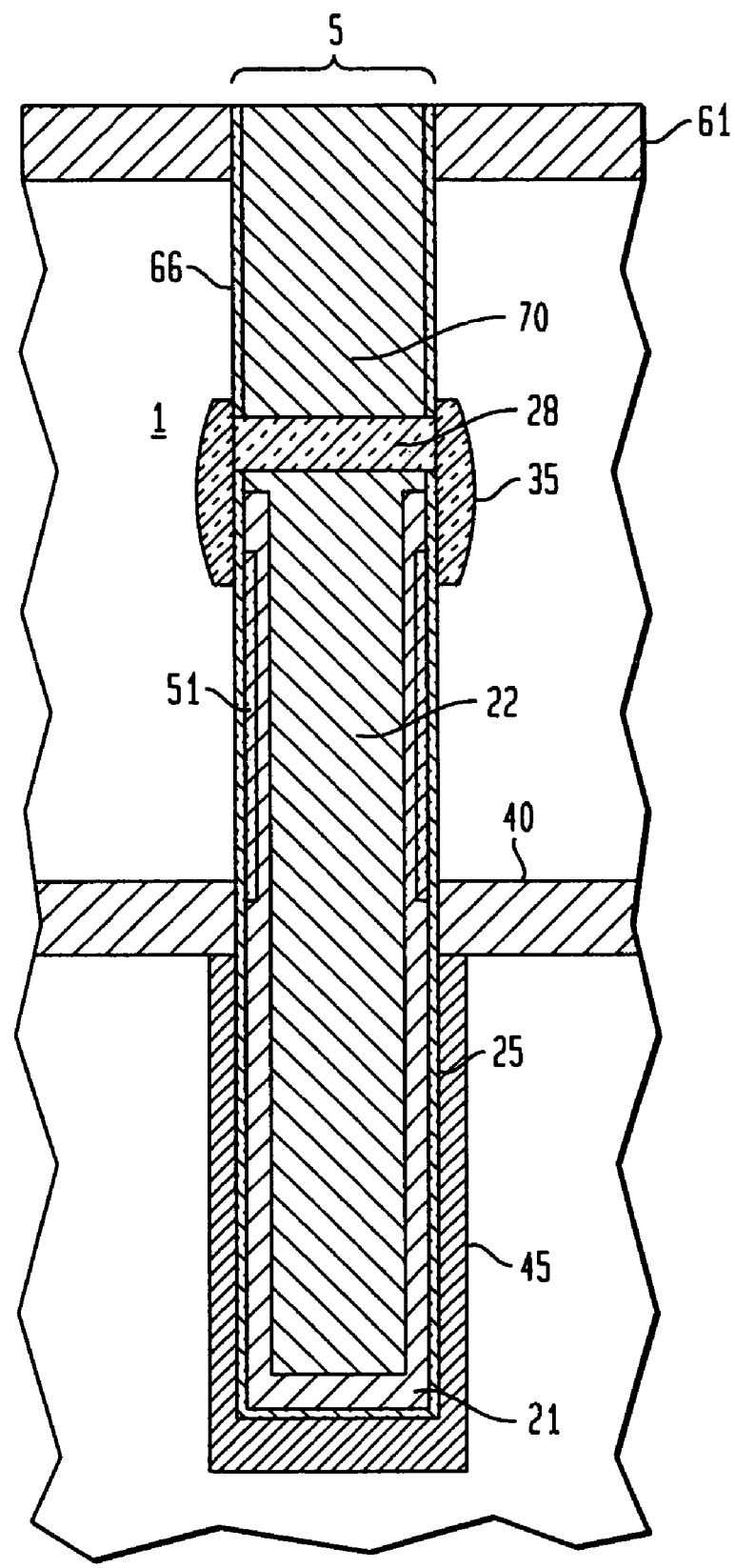

Referring to FIG. 9, trench top oxide (TTO) 28 is then formed on all horizontal surfaces including capacitor node 22 utilizing conventional deposition processes such as high-density plasma-assisted deposition and thereafter a conventional resist recess process is employed to remove the trench top oxide 28 from top surfaces of the structure. A sacrificial oxide layer (not shown) is next formed and stripped utilizing conventional lithography and etching and gate dielectric 66, such as an oxide, is formed on the exposed walls of the upper portion of the deep trench. The gate dielectric 66 is formed in the present invention utilizing any well-known process such as thermal oxidation of silicon or by nitridation of an oxide. Alternatively, a deposited gate dielectric 66, such as by CVD or ALD (atomic layer deposition), may be formed.

A gate conductor 70 such as doped poly-Si is then formed on top trench oxide 28, the structure is then recessed utilizing a conventional recessing process. Optionally, an insulating capping layer (not shown) such as an oxide is formed atop gate conductor 70 utilizing a conventional deposition and planarization process.

In addition to the physical change to the capacitor, electrical modifications are also required in order to compensate for the electrical stresses, in terms of increasing potential difference across the node dielectric 25, produced by substituting the P-type material for the N-type material in the top electrode 21. In order for the P-type metal to function as a low resistance electrode, there must be an adjustment in the voltage swing on capacitor, which is the same as the voltage swing on the bitline that is connected to the capacitor through the vertical transistor in order to get a balanced electrical stress or balanced electric field across the node dielectric 25. The adjustments required are further described as follows.

Substituting a P-type metal for conventional N-type polysilicon electrodes without varying the voltage of the device increases the electrical stress on the node dielectric. An electrical stress is produced at the node dielectric because an electric field exists between the P+ metal liner and the N+ doped diffusion region. Increasing the work function difference between the P+ metal electrode and the N+ buried plate region produces a built in potential difference that increases the electrical stress or the electric field in one direction. The balance of the electrical field in the capacitor is skewed by the difference in the work function of the regions, which in turn causes a directional electrical stress across the dielectric. A balanced electric field exists when the electric field across the node dielectric is the same when the capacitor node is storing a "1" or a "0". The above-described phenomena are depicted in FIGS. 10-12 and are further described, in the following.

Figure 10A:
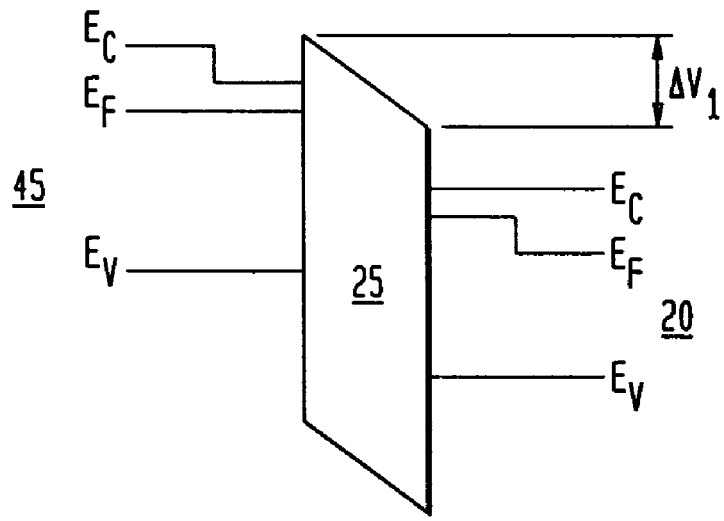
FIGS. 10($a$)-10($b$) depict the band diagram for a conventional capacitor structure, where N+ poly-Si is utilized as the upper electrode.
Figure 10B:
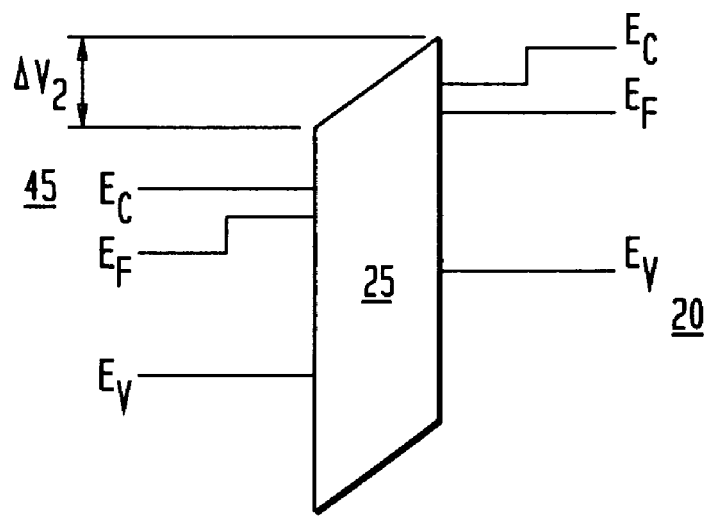
Figure 11A:
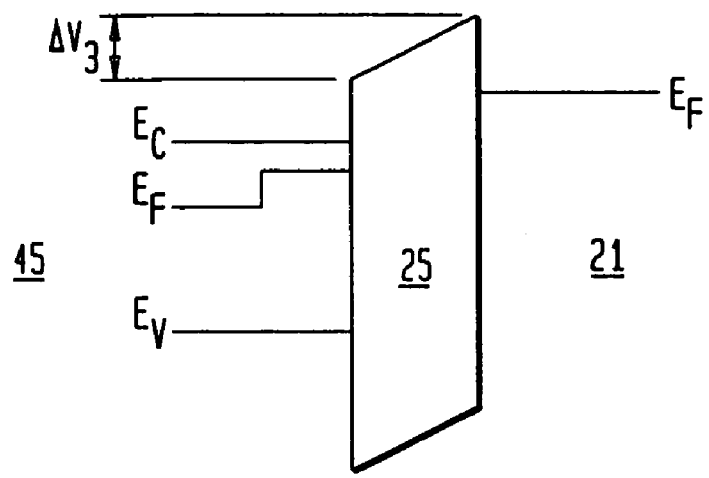
FIGS. 11($a$)-11($b$) depict the band diagram for capacitor structures incorporating P-type metal upper electrodes and biased using conventional voltages.
Figure 11B:
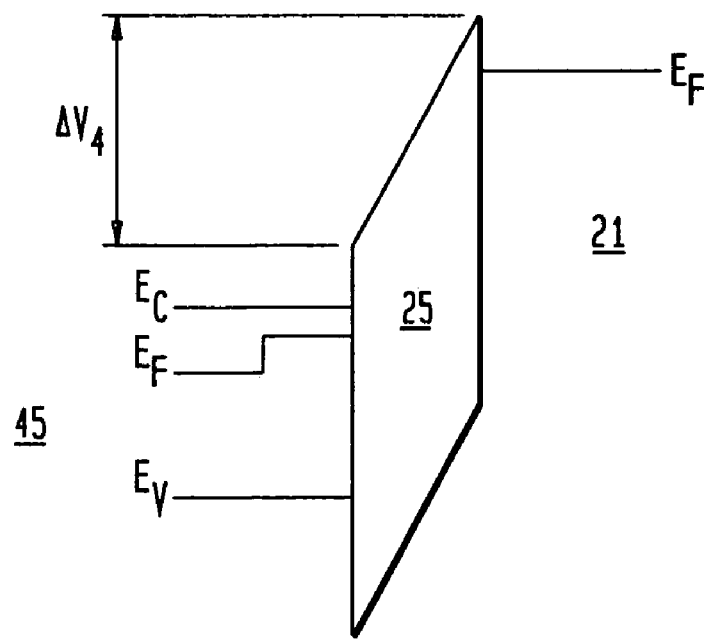

FIGS. 10-12, depict band diagrams that represent the relationship across the node dielectric layer 25 between the upper electrode 21 and the buried plate diffusion region 45. The Fermi level Ef represents the top of the available electron energy levels at low temperatures. The Fermi level Ef is positioned between the conduction band Ec and the valance band Ev. The conduction band Ec is the band of orbitals that are high in energy and are generally empty. In reference to conductivity in semiconductors, it is the band that accepts the electrons from the valence band Ev. The valence band Ev is the band made up of the occupied molecular orbitals and is lower in energy than the so-called conduction band Ec. When the electrons are excited the electrons jump to higher energy levels. If the electrons jump into the conduction band Ec, the material becomes conductive.

FIGS. 10($a$)-10($b$) depict the band diagram of the cross section of a conventional trench capacitor where both the upper electrode 20 and the buried plate 45 are N+ polysilicon and there is no work function difference between the upper electrode 20 and the buried plate 45. Therefore, any voltage applied between the upper electrode 20 and the plate 45 is the full potential difference $\Delta V$ across the node dielectric 25.

Now referring to FIG. 10($a$), depicting a conventional capacitor storing a "1". The upper electrode 20 is biased at 1.0 V, where the Fermi level Ef of the upper electrode is approximately 1.0 eV; and the buried plate 45 is biased at 0.5 V, where the Fermi level Ef of the buried plate is about 0.5 eV. The potential difference $\Delta V1$ of a capacitor comprising an upper electrode of N-type material storing a "1" across the node dielectric 25 is about 0.5 V, corresponding to the difference in the Fermi levels of the upper electrode 20 and the buried plate 45.

Now, referring to FIG. 10($b$), depicting a conventional capacitor storing a "0". The upper electrode 20 is biased at 0.0 V, where the Fermi level Ef of the upper electrode 20 is approximately 0.0 V; and the buried plate is biased at approximately 0.5 V, where the Fermi level Ef of the buried plate 45 is approximately 0.5 V. The resulting potential difference $\Delta V2$ across the node dielectric 25 is approximately −0.5 V. Therefore, a balanced condition exists for storing "1" or "0" in conventional capacitor designs, where the potential difference $\Delta V1$ across the node dielectric 25 when storing a "1" is of approximately the same magnitude of the potential difference $\Delta V2$ across the node dielectric when storing a "0".

Utilizing a P-type metal, instead of N-type polysilicon, as the upper electrode 21 skews the balanced relationship between the upper electrode 21 and the buried plate 45; by the difference in the work function attributed to the P-type upper electrode 21 when compared with N-type poly-Si. The work function of P-type metals is approximately 5.1 eV and the work function of N-type poly-Si is approximately 4.05 eV, so that the difference in the work function between N-type poly-Si and P-type metal is approximately 1.1 V. Substituting P+ metal for N+ doped polysilicon for the upper electrode 21 is like incorporating an internal voltage of approximately −1.1 V, where the internal voltage contributes to the potential difference across the node dielectric 25 and upsets the balanced relationship described above and depicted in FIGS. 10($a$) and 10($b$). Therefore, due to the difference in work function the electrical stress on the node dielectric 25 is much higher in one direction than in the other.

FIG. 11($b$) depicts the band diagram of a capacitor incorporating P-type metal upper electrodes 21 and operated at convention operating voltages where the buried plate 45 is biased at about 0.5 V and the upper electrode 21 is biased from 0.0 V to 1.0 V. Applying conventional operating voltages for storing a "0" in capacitors to a P-type upper electrode 21 results in an increased potential difference $\Delta V4$ in the device of approximately 1.6 V when compared to conventional designs. When storing a "0" the conventional operating voltage applied to the upper electrode 21 is approximately 0.0 V and 0.5 V to the buried plate 45. Applying the conventional operating voltage of 0.0 V for storing a "0" to a P-type metal result in a Fermi level Ef of approximately 1.1 eV instead of a Fermi level Ef of approximately 0.0 eV when utilizing conventional N-type poly-Si. The difference in the Fermi level is attributed to the difference in the work function of the N-type poly-Si and the P-type metal, which is approximately 1.1 eV.

The change in the Fermi levels Ef results in an increased potential difference across the node dielectric. When applying 0.0 V to the top electrode 21 and approximately 0.5 V to the buried plate 45 the change in work function acts as an internal voltage so that the potential difference across the node dielectric 25 is the difference between the Fermi levels Ef of the materials, where the Fermi level Ef of the buried plate is 0.5 eV and the Fermi level Ef of the P-type metal is approximately −1.1 eV, creating a potential difference across the node dielectric of 1.6 V.

When storing a "1", now referring to FIG. 11(a), utilizing P-type metal electrodes and conventional operating voltages the potential difference across the node dielectric 25 is approximately 0.6 V. When storing a "1" using conventional designs 1.0 V is applied to the upper electrode or node 21, 20. Applying a 1.0V to a P-type upper electrode results in a Fermi level Ef of approximately −0.01 eV, as opposed to a Fermi level Ef of approximately 1.0 eV when utilizing conventional designs. The difference is again attributed to the change in work function from the N-type poly Si to the P-type metal as the top electrode 21. Therefore, the potential difference across the node dielectric 25 is approximately 0.6 V, corresponding to the difference between the Fermi level Ef of the buried plate 45 and the P-type metal upper electrode 21. The algebraic difference of the electrical stress (1.0 V, or the difference between a "1" or a "0") when utilizing p-type metal top electrodes 21 remains the same as conventional designs; but the balance is not centered so adjustment is required to compensate for the P+ material and restore a balanced relationship between the buried plate 45 and the upper electrode 21.

In order to compensate for utilizing P+ material the upper electrode 21 and the buried plate 45 are operated at modified voltages so that a balanced relationship across the node dielectric 25 can be maintained. To create a balanced relationship across the node dielectric 25 while utilizing g P-type metal electrode 21, a modified voltage swing from 0.6 V and 1.6 V is applied to the upper electrode 21, while a voltage of 0.0 V is applied to the buried plate. It is important that the bitline low or voltage applied to the P-type metal electrode to store a "0" is 0.6 V instead of 0.0 V.

Figure 12A:
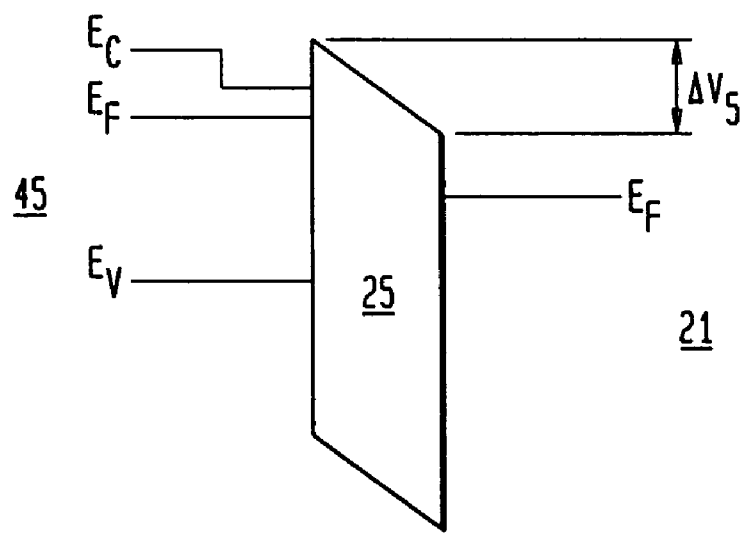
FIGS. 12($a$)-12($b$) depict the band diagram for capacitor structures incorporating P-type metal upper electrodes and biased using modified voltages.
Figure 12B:
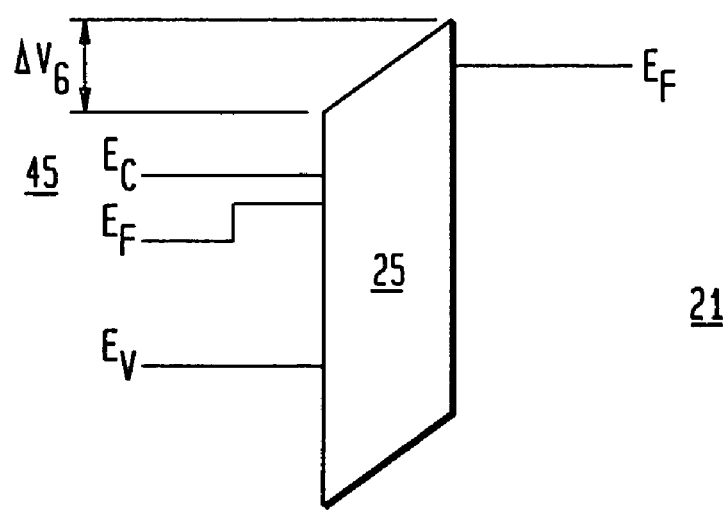

Now referring to FIGS. 12(a) and 12(b), operating at the above-modified voltages compensates for the change in work function associated with the introduction of the P-type metal, therefore restoring a balanced relationship across the node dielectric 25 between the P-type metal electrode 21 and the buried plate diffusion region 45.

Referring to FIG. 12(a), when storing a "1" the P-type metal upper electrode is biased at approximately 1.6 V where the Fermi level Ef of the P-type metal is approximately 0.5 V; and the buried+ plate 45 is biased at approximately 0.0 V, where the buried plate 45 has a Fermi level Ef of approximately 0.0 eV. Therefore the potential difference $\Delta V5$ across the node dielectric 25 is +0.5 V, which is equivalent to the difference of the Fermi levels of the P-type metal upper electrode 21 and the buried plate 45 when operated at the modified voltages for storing a "1".

Referring to FIG. 12(b), when storing a "0" the P-type metal upper-electrode is biased at approximately 0.6 V where the Fermi level Ef of the P-type metal is approximately −0.5 eV; and the buried plate 45 is biased at approximately 0.0 V, where the buried plate 45 has a Fermi level Ef of approximately 0.0 eV. Therefore the potential difference $\Delta V6$ across the node dielectric 25 is −0.5 V, which is corresponds to the difference of the Fermi levels of the p-type metal upper electrode 21 and the buried plate 45 when operated at the modified voltages for storing a "0". Therefore, a balanced condition exists for storing "1" or "0" in the capacitor, where the potential difference $\Delta V5$ across the node dielectric 25 when storing a "1" is of approximately the same magnitude of the potential difference $\Delta V6$ across the node dielectric when storing a "0".

The following examples are given to further illustrate the present invention and to demonstrate some advantages that can arise therefrom.

EXAMPLE 1

Figure 13:
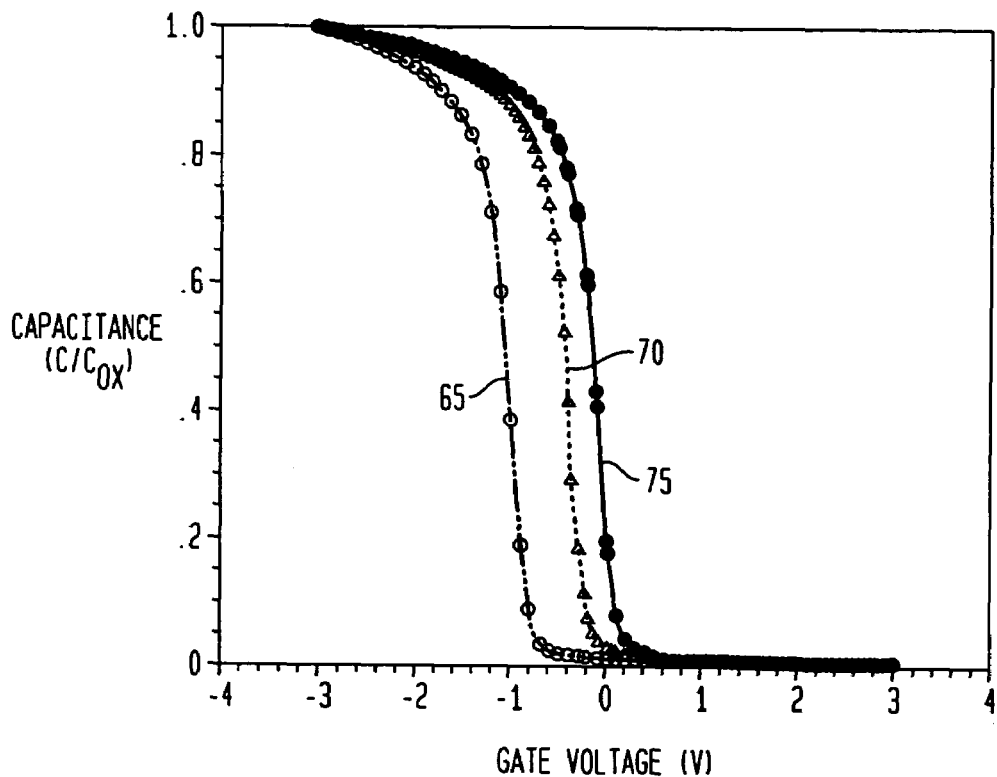
FIG. 13 depicts the Capacitance v. Gate voltage for TiN, TiAlN, and N+ Poly-Si electrodes.

FIG. 13 depicts the relationship between work function of different materials utilized as gate electrodes and capacitance. N+ poly-Si 65 has a work function of approximately 4.05 V; TiN 70 has a work function of approximately 4.7 V; and P-type metals, such as TiAlN 75, have a work function close to the valence band of Si, which is approximately 5.1 V. The shift, depicted in FIG. 13, towards a greater capacitance with increasing gate voltage from N+ poly Si 65 to TiAlN 75 is dependent on the shift in work function.

EXAMPLE 2

Figure 14:
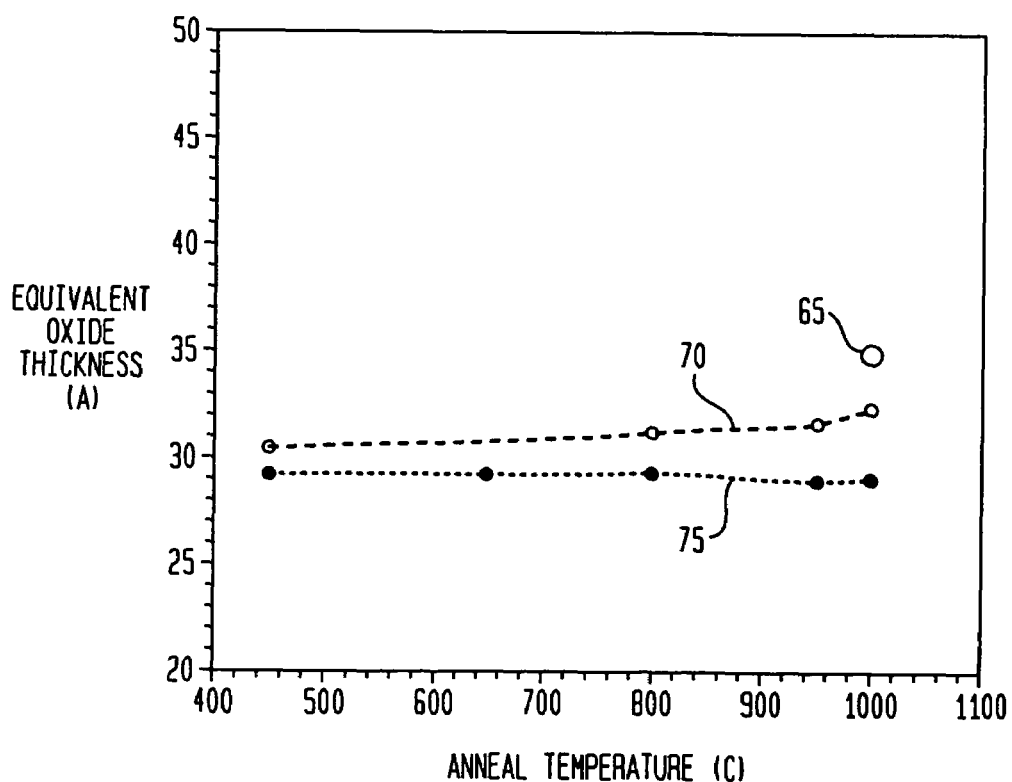
FIG. 14 depicts the Equal Oxide Thickness v. Anneal temperature for TiN, TiAlN and N+ Poly-Si electrodes.

As depicted in FIG. 14, incorporating P-type metal electrodes, such as TiAlN, decreases the incidence of poly-depletion effects. Poly depletion effects are the effective thickening of the node dielectric due to depletion of majority carriers at the Poly-Si/Node dielectric junction when voltage is applied to the upper electrode. FIG. 14 is a plot of the equivalent oxide thickness (EOT) of the node dielectric 25 as a function of annealing temperature. N+ poly Si 65 produces a greater EOT than TiAlN 75, which does not facilitate the occurrence of poly-depletion effects.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method for forming a trench capacitor comprising the steps of:
    forming at least one trench in a substrate;
    forming a buried plate in said substrate about said at least one trench;
    depositing a dielectric layer in said at least one trench; and
    depositing a P-type metal atop said dielectric layer, where said dielectric layer is positioned between said P-type metal and said buried plate.

2. The method of claim 1 where depositing a P-type metal further comprises depositing a metal of TiAlN, Re, Mo, Ir/IRO$_2$, Ru/RuO$_2$, RuTa, or combinations and multilayers thereof.

3. The method of claim 1, where said buried plate comprises of N-type doped silicon.

4. The method of claim 1 where depositing a P-type metal comprises depositing a layer of $(Ti_xAl_y)_{1-z}N_z$, where z comprises the mole fraction of N.

5. The method of claim 4, where z comprises is from about 0.3 to about 0.6.

6. The method of claim 4 where said layer of $(Ti_xAl_y)_{1-z}N_z$ has a work function of approximately 5.1 V.

* * * * *